United States Patent
Yamada

(10) Patent No.: US 6,914,633 B1
(45) Date of Patent: Jul. 5, 2005

(54) CHARGE TRANSFER PATH HAVING LENGTHWISELY VARYING CHANNEL WIDTH AND IMAGE PICKUP DEVICE USING IT

(75) Inventor: Tetsuo Yamada, Miyagi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 812 days.

(21) Appl. No.: 09/680,971

(22) Filed: Oct. 6, 2000

(30) Foreign Application Priority Data

Oct. 7, 1999 (JP) .......................................... 11-287335

(51) Int. Cl.⁷ ............................................. H04N 5/335

(52) U.S. Cl. ........................ 348/315; 348/316; 257/215

(58) Field of Search ................................ 348/315, 316; 257/232, 215

(56) References Cited

U.S. PATENT DOCUMENTS

| | | | | |
|---|---|---|---|---|
| 4,884,143 A | | 11/1989 | Uya | |
| 5,274,476 A | * | 12/1993 | Lee | ............................ 358/483 |
| 5,306,906 A | * | 4/1994 | Aoki et al. | .............. 250/208.1 |

FOREIGN PATENT DOCUMENTS

| | | |
|---|---|---|
| DE | 42 26 828 A | 2/1993 |
| DE | 44 22 825 A | 1/1995 |

OTHER PUBLICATIONS

Patent Abstracts of Japan, vol. 018, No. 643, Dec. 7, 1994 & JP 06 252375 A, Sep. 9, 1994.
Patent Abstracts of Japan, vol. 018, No. 326, Jun. 21, 1994 & JP 06 077450 A, Mar. 18, 1994.

* cited by examiner

Primary Examiner—Tuan Ho
Assistant Examiner—Heather R. Long
(74) Attorney, Agent, or Firm—Arent Fox PLLC

(57) ABSTRACT

A solid state image pickup device of high integration, high photoelectric conversion and high transfer performances is made of: a plurality of photoelectric conversion elements disposed in a matrix shape on the surface of a semiconductor substrate, the photoelectric conversion elements in an even column being shifted by about a half of a photoelectric conversion element pitch in the even column from the photoelectric conversion elements in an odd column, and the photoelectric conversion elements in an even row being shifted by about a half of a photoelectric conversion element pitch in the even row from the photoelectric conversion elements in an odd row; a plurality of transfer channel regions formed on the semiconductor substrate, each being disposed near a corresponding photoelectric conversion element column, having a stripe plan shape, and extending and weaving along the column direction; and a plurality of transfer electrodes traversing the transfer channel regions and extending as a whole in the row direction, the transfer electrodes having an overlap structure that end portions of adjacent transfer electrodes overlap to define a plurality of border lines of the transfer channel region, and defining a plurality of charge transfer sections partitioned by the border lines in the channel regions, wherein each transfer channel region includes a region where a plurality of charge transfer sections are juxtaposed along the row direction.

27 Claims, 11 Drawing Sheets

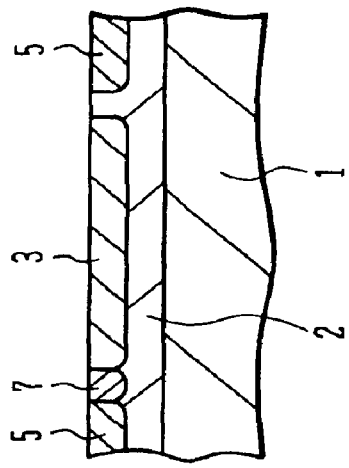
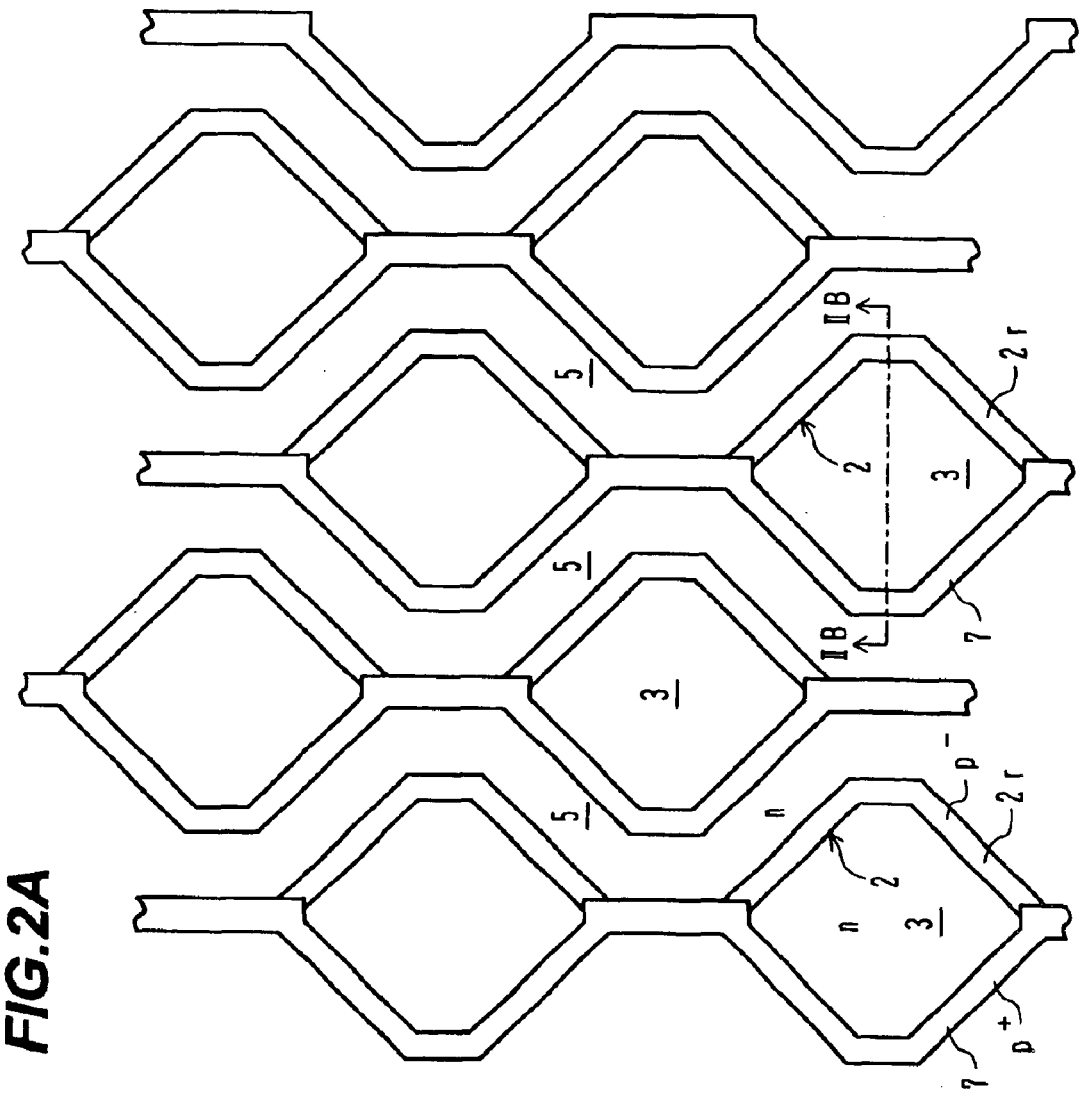

CHARGE TRANSFER PATH HAVING LENGTHWISELY VARYING CHANNEL WIDTH AND IMAGE PICKUP DEVICE USING IT

This application is based on Japanese Patent Application HEI 11-287335, filed on Oct. 7, 1999, the entire contents of which are incorporated herein by reference.

BACKGROUND OF THE INVENTION a) Field of the Invention

The present invention relates to a novel charge transfer path and a solid state image pickup device using it, and more particularly to a charge transfer path having an improved charge transfer performance and a solid state image pickup device using such a charge transfer path.

In this specification, transfer performance is intended to mean a concept including both a transfer speed and a transfer efficiency.

b) Description of the Related Art

A charge transfer path can be made by forming an vertically extending transfer channel region of a first conductivity type on the surface of a semiconductor region of a first conductivity type and forming a plurality of transfer electrodes on the surface of the transfer channel region via an insulating film. The transfer electrode capacitively couples the transfer channel region and can control the potential of the transfer channel region by adjusting a voltage applied to the electrode. In order to continuously transfer electric charges, a plurality of transfer electrodes are formed above the transfer channel region so that end portions of the electrodes are overlapped each other.

An example of semiconductor devices using such charge transfer paths is a solid state image pickup device. A solid state image pickup device has photoelectric conversion elements disposed in a matrix shape in a light reception area and charge transfer paths formed near respective photoelectric conversion columns. Electric charges accumulated in each photoelectric conversion element are read to and transferred to the charge transfer path to eventually supply the electric charges representative of image information to an external circuit.

Generally, photoelectric conversion elements are disposed in a square matrix shape and charge transfer paths are formed linearly along a column direction near respective photoelectric conversion element columns. Transfer electrodes for controlling the potentials of charge transfer paths extend along a row direction and have each a shape retracting from the area of each photoelectric conversion element.

JP-A-8-288856 proposes a solid state image pickup device which adopts a pixel-shift layout shifting pixels about a half pitch in both column and row directions. Photoelectric conversion elements as pixels in each column are disposed at a constant pitch, and photoelectric conversions in each row are disposed also at a constant pitch.

Photoelectric conversion elements in each even column are disposed shifted by about a half pitch thereof from photoelectric conversion elements in each odd column. Photoelectric conversion elements in each even row are disposed shifted by about a half pitch thereof from photoelectric conversion elements in each odd row.

FIG. 11 is a schematic diagram showing the structure of such a solid state image pickup device. A number of pixels (photoelectric conversion elements) PIX are disposed in a matrix shape at a pitch $P_V$ in the column direction and at a pitch $P_H$ in the row direction. Photoelectric conversion elements in adjacent columns are disposed shifted by about a half pitch of $P_V$ in the column direction, and photoelectric conversion elements in adjacent rows are disposed shifted by about a half pitch of $P_H$ in the row direction.

A color filter is formed on each pixel PIX to form a color solid state image pickup device. Colors of respective pixels are represented by G (green), B (blue) and R (red). A channel stopper region CS extends in the column direction, surrounding one sides of pixels PIX and electrically insulating the photoelectric conversion element column from other columns. A vertical charge transfer channel is therefore formed in an area sandwiched between the channel stopper region CS and corresponding pixels PIX.

Charge transfer electrodes E1 and E2 extending in the row direction are formed by first and second polysilicon films formed on the semiconductor substrate surface via silicon oxide films. The first and second polysilicon films are covered with silicon oxide films to electrically insulate them.

Two charge transfer electrodes are formed for each row. In the arrangement shown in FIG. 11, one pixel PIX is formed for two rows in each column so that four transfer electrodes are formed for each pixel in each column. These four electrodes per pixel are four-phase driven so that electric charges read from each pixel can be transferred independently in the vertical direction.

A plurality of charge transfer electrodes for transferring electric charges in the charge transfer paths along the column direction are disposed being overlapped in the column direction. With the pixel shift layout, the positions of adjacent pixels can be disposed being overlapped in both row and column directions. It is also easy to acquire a plurality of information pieces at the same position through interpolation of information of adjacent pixels. This pixel shift layout is therefore effective for obtaining an image at a high pixel density.

However, as the area of each pixel is increased, it is essential that the transfer path has a zigzag-shape. A zigzag-shaped transfer path has a longer charge transfer distance than a linear transfer path. As the transfer distance becomes longer, the transfer time is likely to become long.

SUMMARY OF THE INVENTION

It is an object of the present invention to provide a charge transfer path capable of improving a transfer performance.

It is another object of the present invention to provide a solid image pickup device having a pixel shift layout capable of realizing high pixel integration and improving a transfer performance of each transfer path without degrading the performance of photoelectric conversion elements.

It is still another object of the present invention to provide an efficient method of driving a solid state image pickup device having a pixel shift layout.

According to one aspect of the present invention, there is provided a charge transfer path comprising: a semiconductor substrate having a surface region of a first conductivity type; a channel region formed in the surface region and extending as a whole along one direction (extension direction) on a surface of the semiconductor substrate, the channel region having a second conductivity type opposite to the first conductivity type and having a stripe plan shape defined by a pair of side edges; an insulating film formed on the semiconductor substrate and covering the channel region; and a plurality of transfer electrodes formed on the insulating film and traversing the channel region, the transfer electrodes having an overlap structure that end portions of adjacent transfer electrodes overlap to define a plurality of border lines of the channel region, and defining a plurality of charge transfer sections partitioned by the border lines in the channel region, wherein each transfer channel region includes a region where a plurality of charge transfer sections are juxtaposed along a direction perpendicular to the extension direction.

According to another aspect of the present invention, there is provided a solid state image pickup device, comprising: (a) a semiconductor substrate defining a two-dimensional surface; (b) a number of photoelectric conversion elements disposed on the surface of the semiconductor substrate along a plurality of rows and columns at constant pitches, the photoelectric conversion elements in an even column being shifted by about a half of a photoelectric conversion element pitch in the even column from the photoelectric conversion elements in an odd column, the photoelectric conversion elements in an even row being shifted by about a half of a photoelectric conversion element pitch in the even row from the photoelectric conversion elements in an odd row, and each photoelectric conversion element column including only the photoelectric conversion elements in either the odd column or the even column; (c) a plurality of transfer channel regions formed on the semiconductor substrate, each being disposed near a corresponding photoelectric conversion element column, having a stripe plan shape defined by a pair of side edges, and extending and weaving along the column direction; and (d) a plurality of transfer electrodes traversing the transfer channel regions and extending as a whole in the row direction, the transfer electrodes having an overlap structure that end portions of adjacent transfer electrodes overlap to define a plurality of border lines of the transfer channel region, and defining a plurality of charge transfer sections partitioned by the border lines in the channel regions, wherein each transfer channel region includes a region where a plurality of charge transfer sections are juxtaposed along a direction perpendicular to the extension direction.

According to another aspect of the present invention, there is provided a method of driving a solid state image pickup device, comprising: a semiconductor substrate defining a two-dimensional surface; a number of photoelectric conversion elements disposed on the surface of the semiconductor substrate along a plurality of rows and columns at constant pitches, the photoelectric conversion elements in an even column being shifted by about a half of a photoelectric conversion element pitch in the even column from the photoelectric conversion elements in an odd column, the photoelectric conversion elements in an even row being shifted by about a half of a photoelectric conversion element pitch in the even row from the photoelectric conversion elements in an odd row, and each photoelectric conversion element column including only the photoelectric conversion elements in either the odd column or the even column; a plurality of transfer channel regions formed on the semiconductor substrate, each being disposed near a corresponding photoelectric conversion element column, having a stripe plan shape defined by a pair of side edges, and extending and weaving along the column direction; and a plurality of transfer electrodes traversing the transfer channel regions and extending as a whole in the row direction, the transfer electrodes having an overlap structure that end portions of adjacent transfer electrodes overlap to define a plurality of border lines of the transfer channel region, and defining a plurality of charge transfer sections partitioned by the border lines in the channel regions, wherein each transfer channel region includes a region where a plurality of charge transfer sections are juxtaposed along a direction perpendicular to the extension direction, the method comprising the steps of: accumulating electric charges in the photoelectric conversion elements; applying a read level voltage to a first charge transfer section near the photoelectric conversion elements and applying a transfer high level voltage to a second charge transfer section adjacent to the first charge transfer section in the row direction; and changing the voltage applied to the first charge transfer section to the transfer high level voltage.

With the arrangement described above, the transfer performance of a charge transfer path can be improved.

A zigzag-shaped charge transfer path having a higher transfer performance than a linear charge transfer path can be realized.

A solid state image pickup device having a pixel shift layout is desired to have zigzag-shaped charge transfer paths. Problems associated with zigzag-shaped charge transfer paths described above can be solved.

BRIEF DESCRIPTION OF THE DRAWINGS

FIGS. 2A and 2B are a schematic diagram showing the surface layout of a semiconductor substrate with impurity doped regions formed therein and a cross sectional view of the substrate, according to the solid state image pickup device of the first embodiment.

DETAILED DESCRIPTION OF THE PREFERRED EMBODIMENTS

Figure 1:
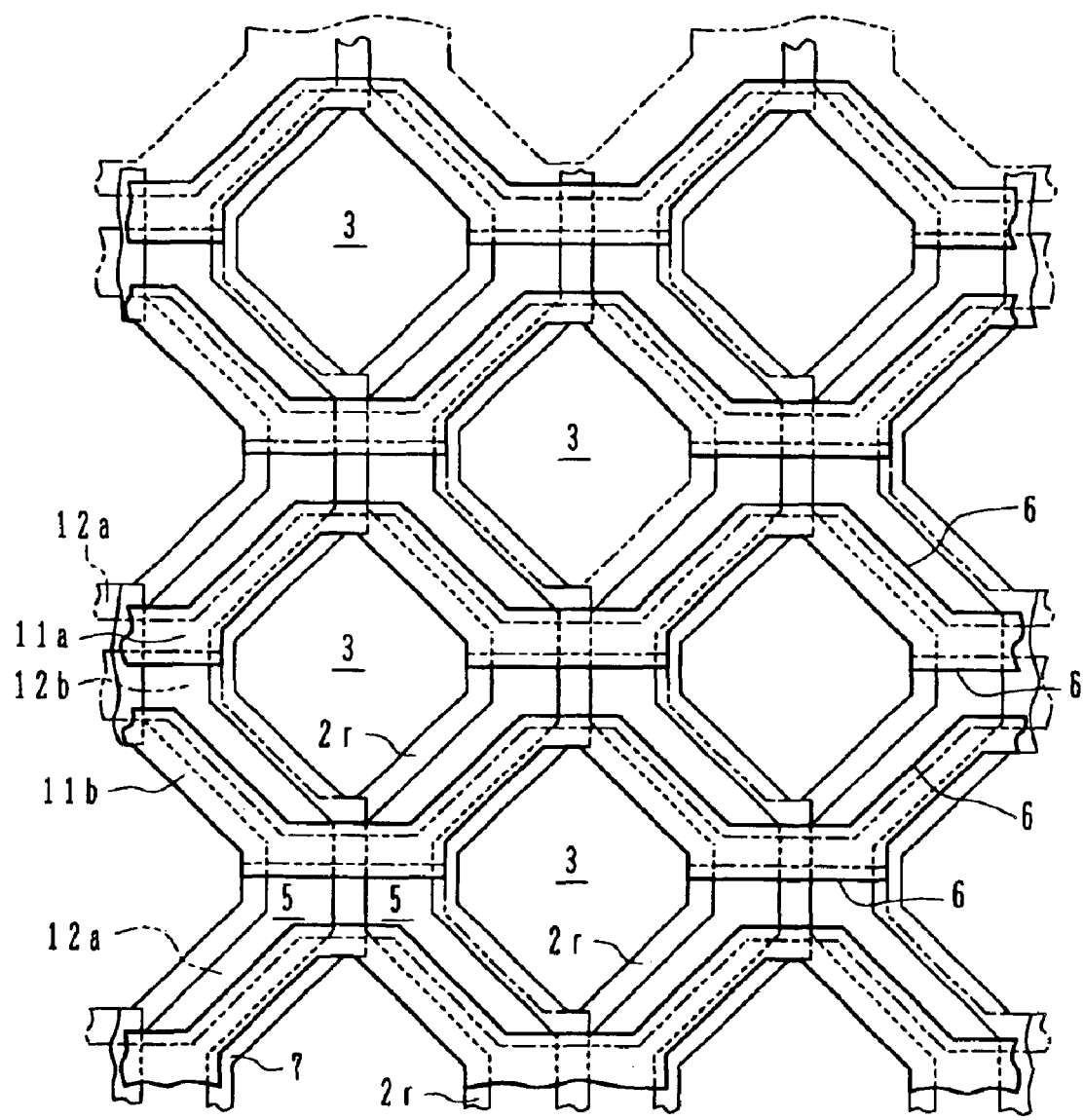
FIG. 1 is a schematic plan view of a solid state image pickup device according to a first embodiment of the invention.

FIGS. 1 to 5 show a solid state image pickup device according to a first embodiment of the invention. FIG. 1 is a plan view of a semiconductor substrate with transfer electrodes formed thereon. FIG. 2A is a diagram showing an example of the surface layout of a semiconductor substrate with impurity doped regions formed therein. FIG. 2B is a schematic cross sectional view taken along line IIB—IIB shown in FIG. 2A. FIG. 3A is a schematic diagram showing the layout of two-layered polysilicon electrodes formed on the substrate surface, and FIGS. 3B and 3C are schematic cross sectional views of the semiconductor substrate taken along lines IIIB—IIIB and IIIC—IIIC shown in FIG. 3A.

As shown in FIG. 1A, on the surface of a semiconductor substrate made of silicon or the like, n-type regions 3 are disposed in a matrix shape, as charge accumulation regions of photoelectric conversion elements. With the arrangement shown in FIG. 1, n-type regions 3 in an odd column are disposed being shifted by about a half pitch from n-type regions 3 in an even column, and also n-type regions 3 in an odd row are disposed being shifted by about a half pitch from n-type regions 3 in an even row.

As shown in FIG. 2A, a $p^+$-type region 7 is formed extending in the column direction on the column left side and surrounding the left sides of n-type regions 3. The $p^+$-type region 7 electrically isolates each column. An n-type region 5 is formed in a zigzag shape in the column direction, weaving between the $p^+$-type region and the left side n-type region 3 in an area between adjacent $p^+$-type regions 7. Between this n-type region 5 and n-type region 3, a p-type region 2 is exposed to constitute a read gate region.

As shown in FIG. 2B, the $p^-$-type region 2 is made of a p-type well formed in an n-type silicon substrate 1. In this p-type well 2, the n-type regions 3 and 5 and $p^+$-type region 7 are formed. The n-type region 3 constitutes a charge accumulation region of a photodiode which forms a photoelectric conversion element as a pixel. The charge accumulation region is also called a photoelectric conversion element in this specification. The n-type region 5 constitutes a vertical transfer channel for transferring electric charges in the column direction. Each impurity doped region is formed, for example, by ion implantation and annealing to follow.

On the surface of the semiconductor substrate having the structure shown in FIGS. 2A and 2B, an insulating film such as a silicon oxide film is formed through thermal oxidation and thereafter a stacked structure of transfer electrodes made of polysilicon or the like is formed.

Figure 3B:
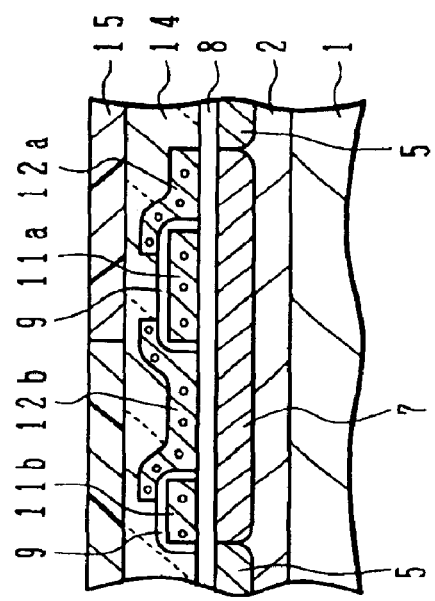
FIGS. 3A, 3B and 3C are a plan view showing the patterns of two layered transfer electrodes and cross sectional views taken along lines IIIB—IIIB and IIIC—IIIC shown in FIG. 3A, according to the solid state image pickup device of the first embodiment.
Figure 3C:
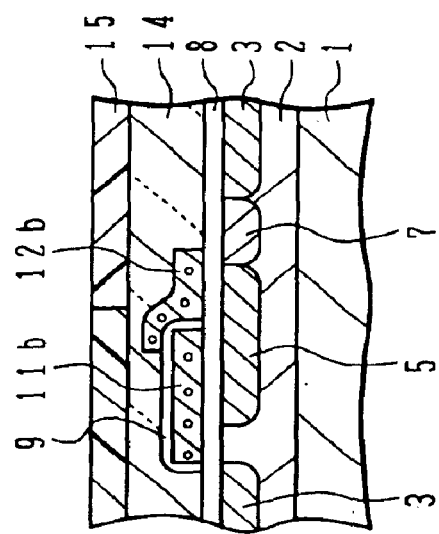
Figure 3A:
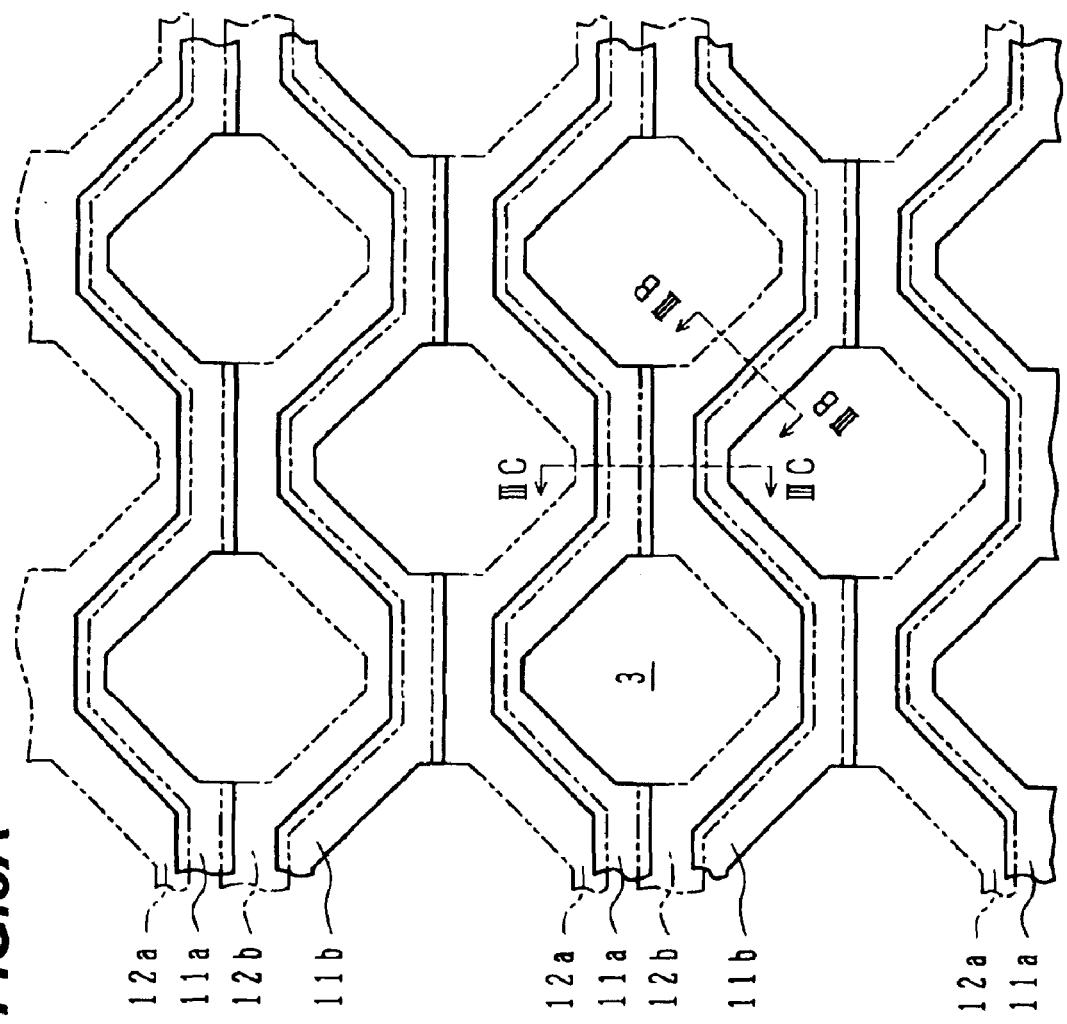

FIG. 3A is a plan view showing the shape of a transfer electrodes. FIGS. 3B and 3C are cross sectional views taken along lines IIIB—IIIB and IIIC—IIIC shown in FIG. 3A.

A thermal oxidation film 8 is formed on the semiconductor substrate surface, and a first layer polysilicon film is formed on this thermal oxidation film 8. The first polysilicon layer is patterned through photolithography and etching to form first polysilicon transfer electrodes 11a and 11b. The first polysilicon transfer electrodes 11a and 11b have patterns such as shown in FIG. 3A and are disposed surrounding the upper side of the n-type regions 3 as charge accumulation regions.

After the first polysilicon transfer electrodes 11a and 11b are formed, an oxide film 9 is formed through thermal oxidation on the substrate surface. After the thermal oxidation film 9 is formed, a second polysilicon layer is formed over the substrate surface. The second polysilicon layer is patterned through photolithography and etching to form second polysilicon transfer electrodes 12a and 12b. The second polysilicon transfer electrodes have patterns indicated by two-dot chain lines in FIG. 3A and surround the lower side of the n-type regions 3.

As shown in FIGS. 3B and 3C, the first polysilicon transfer electrodes 11 (collective representation of 11a and 11b) and second polysilicon transfer electrodes 12 (collective representation of 12a and 12b) have an overlapped structure with end portions being stacked upon each other.

The structure that the stacked transfer electrodes shown in FIG. 3A are formed on the substrate shown in FIG. 2A becomes as shown in FIG. 1.

After the stacked transfer electrodes 11 and 12 are formed, an insulating film 14 having a flat surface is formed over the stacked transfer electrodes 11 and 12, as shown in FIGS. 3B and 3C. For example, the insulating film 14 is made of a lamination of a silicon oxide containing insulating film and an insulating film having a planarizing function. A color filter layer 15 is formed on this insulating film 14.

The color filter layer 15 covers the charge accumulation region 3 of each pixel and allows light having only a desired wavelength to become incident upon each pixel. A planarizing insulating film having a planarizing function is again formed on the color filter layer 15, and a light shielding film is formed on the planarizing insulating film. The light shielding film has openings in areas corresponding to the charge accumulation regions. Another planarizing film having a planarizing function is again formed on the light shielding film, and micro lenses are formed on the planarizing film. For the general structure of a solid state image pickup device, for example, refer to the descriptions of embodiments in JP-A-61-25224.

As shown in FIG. 1, the transfer channel region 5 formed with the stacked transfer electrodes thereon is divided into a plurality of sections by the transfer electrodes. These sections are defined by border lines 6 of the first polysilicon transfer electrodes 11.

Figure 4A:
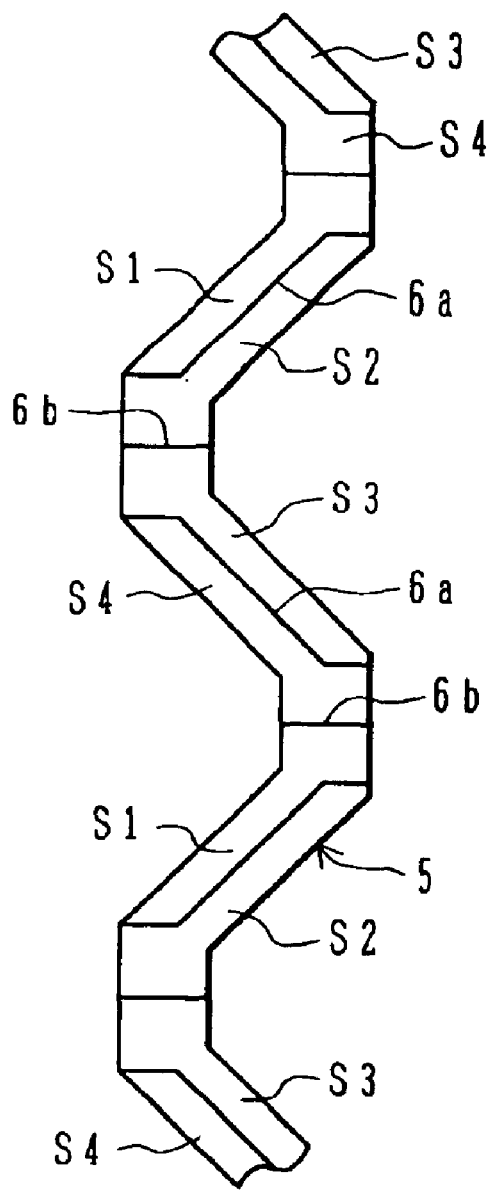
FIGS. 4A and 4B are a diagram showing sections of a charge transfer channel and a schematic cross sectional view illustrating narrow channel effects, according to the solid state image pickup device of the first embodiment.

FIG. 4A is a schematic plan view showing sections of the transfer channel region 5. The transfer channel region 5 is divided into sections S1, S2, S3 and S4 by the first and second polysilicon transfer electrodes 11 and 12 formed over the channel region 5. These four sections S1 to S4 are disposed repetitively in the column direction.

The second polysilicon transfer electrode 12 is disposed in the first section S1. The first polysilicon transfer electrode 11 is disposed in the second section S2. Similarly, the second and first polysilicon transfer electrodes 12 and 11 are disposed respectively in the sections S3 and S4. An odd transfer column has a shape shifted by about a half pitch in the column direction from the shape of an even transfer column.

In the layout shown in FIG. 4A, each section has a narrow region and a wide region. Adjacent sections S1 and S2 contact each other at a border line 6a—having a long straight oblique side and short horizontal sides continuous with the long straight oblique side.

This oblique side is disposed in parallel to the edge of the transfer channel region and divides the transfer channel region into two narrow regions disposed in the row direction. Each narrow region has a constant width. This region having the constant width presents uniform narrow channel effects. It is not necessary that the oblique side is strictly parallel to the side edge of the transfer channel region, but it is sufficient if the oblique side is substantially parallel to the side edge. On both sides of the juxtaposed narrow regions, wide regions are formed continuously with the narrow regions.

The wide regions of the sections S2 and S3 contact each other at a horizontal border line 6b. The wide region is less influenced by the narrow channel effects and has a low potential.

Figure 4B:
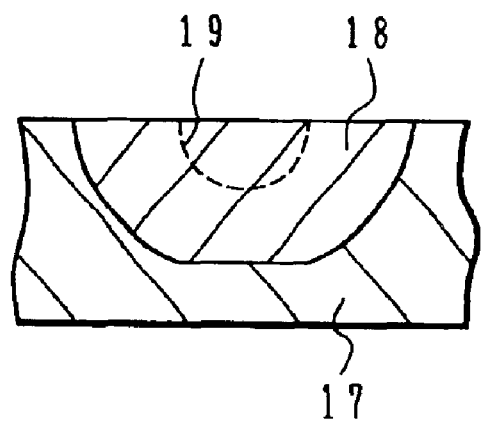

FIG. 4B is a cross sectional view schematically illustrating the narrow channel effects. An n-type region 18 is formed in an p⁻-type region 17. A built-in potential between the p⁻-type region 17 and n-type region 18 and an applied voltage form a depletion layer near a p-n junction between the p-type region 17 and n-type region 18. A broken line 19 schematically shows one equipotential plane in the state that such a depletion layer is being formed. If the width of the n-type region 18 is small, the depletion layer expanding inward raises the potential at the bottom of a central region. The equipotential plane contracts not only in the width direction but also in the depth direction. The potential is therefore raised in the narrow semiconductor region by the narrow channel effects.

As the width of the charge transfer path becomes smaller, it becomes difficult not to be subjected from the narrow channel effects. As the width of the charge transfer changes, the charge transfer path has a potential distribution which makes it difficult to smoothly transfer electric charges. For example, the charge transfer path is formed so as to satisfy the condition that the n-type region is completely depleted only by a built-in potential.

Each section of the charge transfer path 5 shown in FIG. 4A has the wide region and narrow region. Since the width of the narrow region is constant, the narrow effects in the narrow region are uniform. The wide region has a higher percentage of being influenced by the narrow channel effects than the narrow region, and has a lower potential than the narrow region. Therefore, electric charges are more dominantly accumulated in the wide region than in the narrow region.

When electric charges are to be transferred from the section S4 to the section S1, the potential at the section S1 is lowered to transfer electric charges more dominantly accumulated in the wide region of the section S4 quickly to the wide region of the section S1. The transfer performance of charges from the section S4 to the section S1 can therefore be improved.

The sections S1 and S2 contact at the long border line 6a. When electric charges are to be transferred from the section S1 to the section S2, the potential at the section S2 is lowered to transfer electric charges in a direction traversing the long border line 6a. Namely, electric charges are transferred not along a lengthwise direction of the charge transfer path 5 but along the direction traversing the long border line 6a. Since the cross sectional area of the transfer region is large, the transfer performance of transferring electric charges across the border line 6a can be improved.

A high transfer performance can therefore be expected although the charge transfer path with the stacked transfer electrode structure has a zigzag shape as shown in FIG. 1. The transfer performance was measured, which confirmed a good transfer performance.

Figure 5:
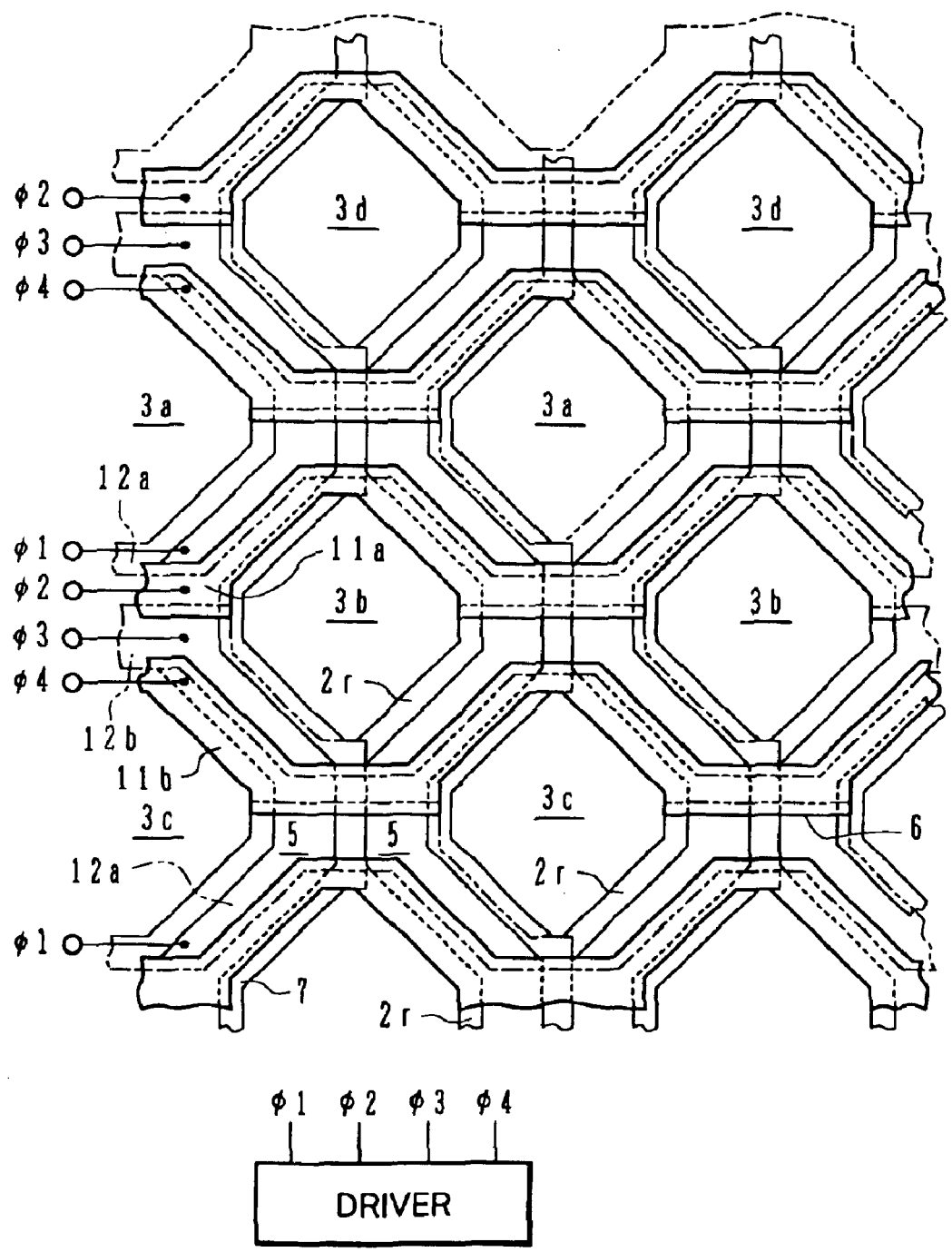
FIG. 5 is a schematic plan view showing electrical connection of a driver circuit according to the solid state image pickup device of the first embodiment.

FIG. 5 illustrates how a driver circuit is connected to transfer electrodes. The driver circuit is assumed to be a four-phase driver circuit. A first-phase driver source φ1 is connected to the second-layer transfer electrode 12a, and a second-phase driver source φ2 is connected to the first-layer transfer electrode 11a. Similarly, third- and fourth-phase driver sources φ3 and φ4 are respectively connected to the second-layer and first layer transfer electrodes 12b and 11b.

Figure 6:
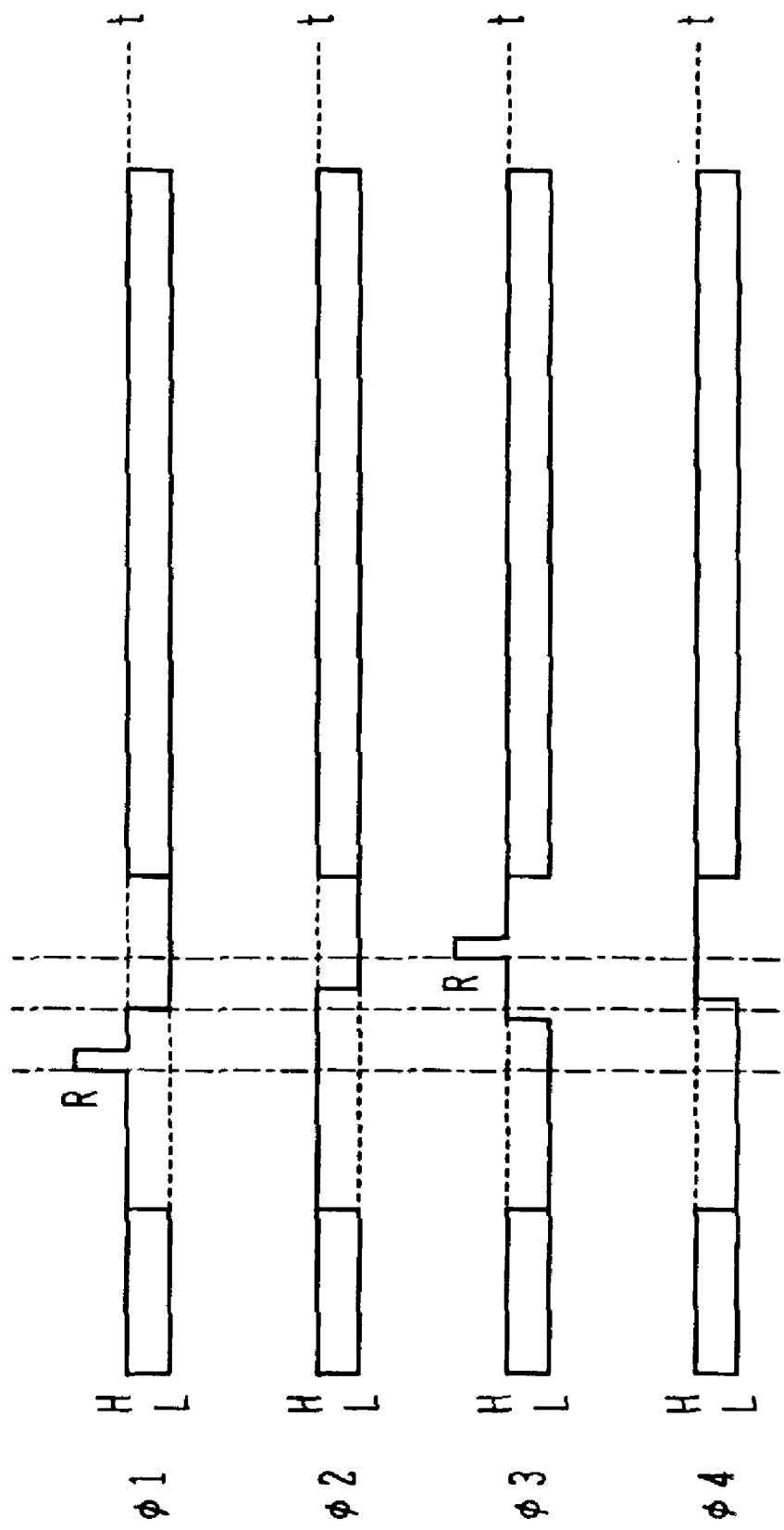
FIG. 6 is a timing chart schematically illustrating a method of driving the solid state image pickup device of the first embodiment.

FIG. 6 is a timing chart of signals illustrating a method of driving a solid state image pickup device using four-phase drive signals. Each drive signal takes a transfer high level H, a transfer low level L and a read level R higher then H. For example, the read level R is +15 V at which level electric charges can be read from the charge accumulation region to the charge transfer path 5 via the p⁻-type region 2. The transfer high level H takes, for example, a ground potential, and the transfer low level takes, for example, -8 V.

The operation of applying the read level signal to the second-layer transfer electrodes 12 will be described. The region disposed under the second-layer transfer electrode 12 in the p⁻-type region 2 becomes a read gate region 2r (refer to FIGS. 1 and 2A).

As shown in FIG. 6, the first- and second-phase drive signals φ1 and φ2 are set to the high level and the third- and fourth-phase drive signals φ3 and φ4 are maintained at the low level. In this state, the first-phase drive signal φ1 is raised to the read level R. Upon application of this read level R, electric charges are read from charge accumulation regions 3a and 3c shown in FIG. 5 to the adjacent charge transfer path 5. Thereafter, the first-phase drive signal is again set to the transfer high level.

The read electric charges are distributed under the second-layer transfer electrodes 12a and first-layer transfer electrodes 11a. Since the whole width of the transfer channel region is used for charge accumulation, a read transfer performance can be improved. The first-phase drive signal may be set directly to the read level without once setting it to the transfer high level.

In this state, for example, electric charges accumulated in charge accumulation regions 3b and 3d shown in FIG. 5 are not still read to the charge transfer path but still remain in the charge accumulation regions 3b and 3d. In this state, therefore, electric charges have been read to a half of all the charge transfer paths 5 and still not read to the remaining half of all the charge transfer paths. In order to read electric charges to all transfer paths, it is necessary to further read electric charges from the photoelectric conversion elements 3b and 3d.

Next, the first- and second-phase drive signals φ1 and φ2 are set to the low level, and the third- and fourth-phase drive signals φ3 and φ4 are set to the transfer high level. Then, the third-phase drive signal φ3 is raised to the read level R. Upon application of the read level, electric charges accumulated in the charge accumulation regions 3b and 3d shown in FIG. 5 are read to the adjacent charge transfer path 5.

In this state, the transfer electrodes are four-phase driven to transfer the read electric charges in the column direction.

In place of the driver circuit shown in FIG. 5, an eight-phase driver circuit may be connected to the transfer electrodes. By reading electric charges from a half of all charge accumulation regions and performing eight-phase driving, the transfer speed can be increased.

Figure 7:
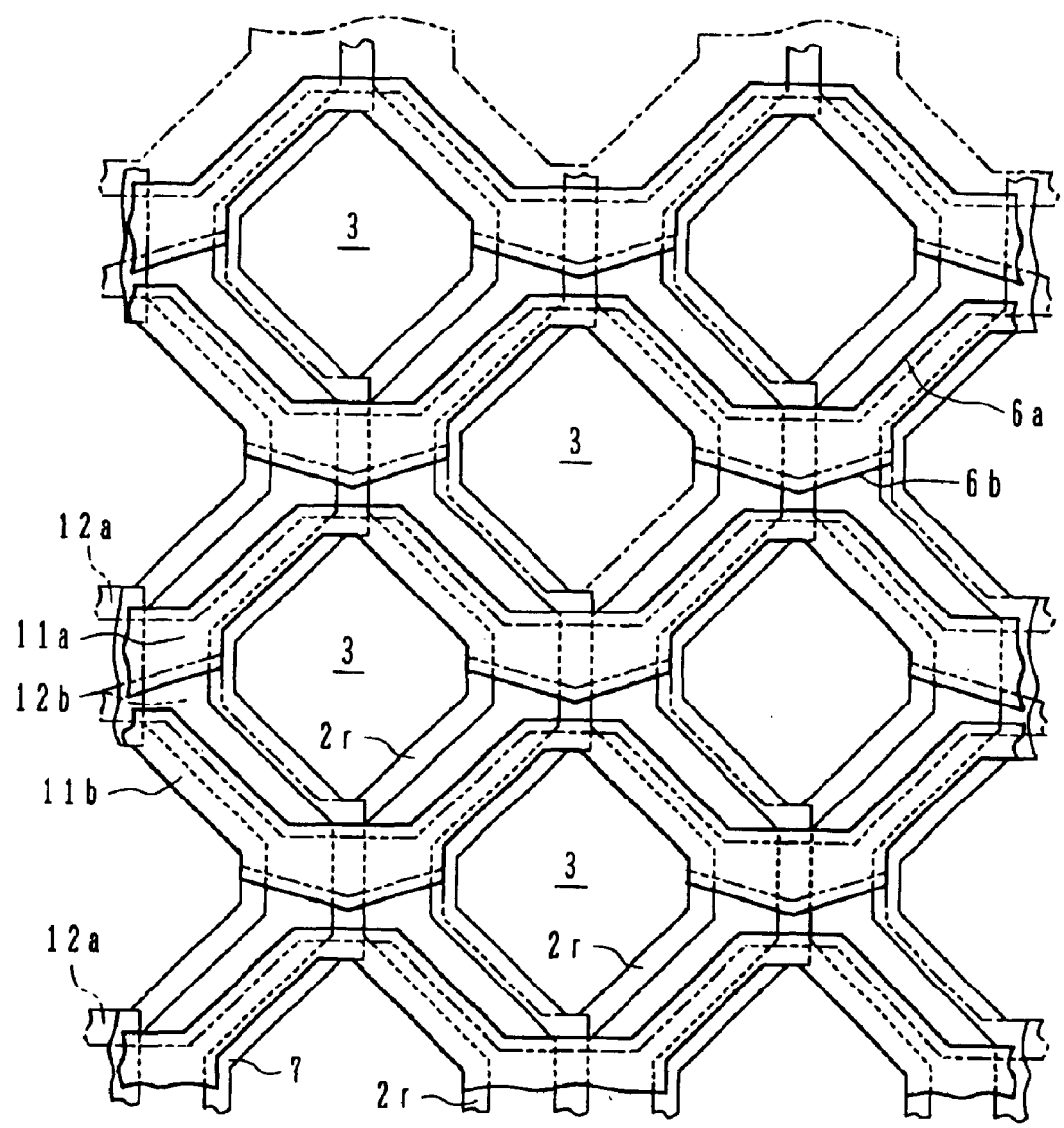
FIG. 7 is a plan view showing a modification of the first embodiment.

FIG. 7 shows a modification of the first embodiment. In this modified arrangement, a border line 6b along which adjacent charge transfer paths face each other via the channel stopper region is slanted relative to the row direction. This slanted arrangement elongates the border line 6b. The cross sectional area through which electric charges transferred from one section to the next section is therefore made large. The transfer efficiency can be improved further.

Figure 8A:
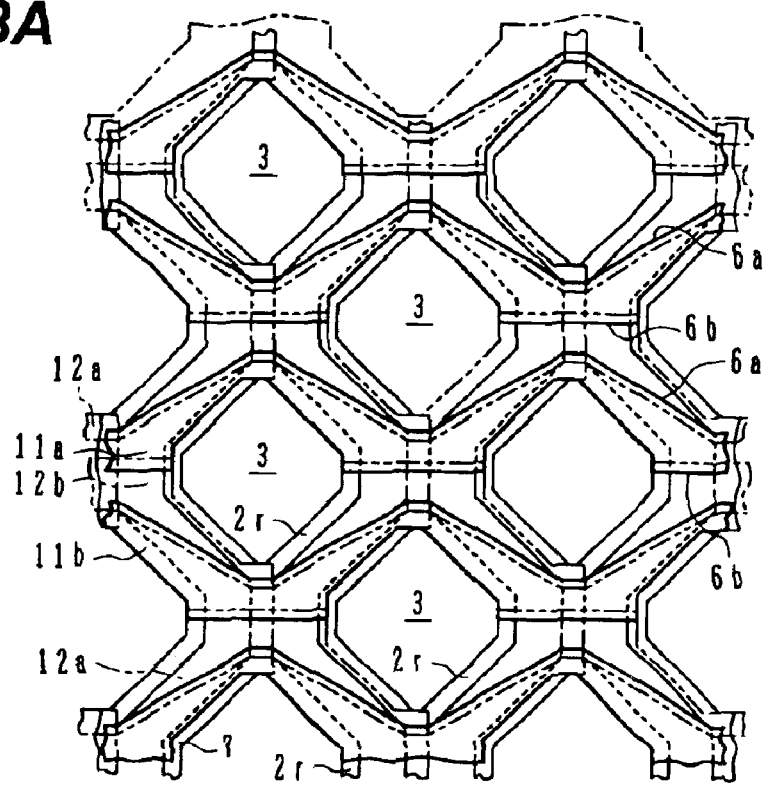
FIGS. 8A and 8B are schematic plan views showing the structures of a solid state image pickup device according to a second embodiment of the invention and its modification.

FIG. 8A is a plan view of a solid state image pickup device according to a second embodiment of the invention. Photoelectric conversion elements are disposed in a matrix shape in the pixel shift arrangement, charge transfer paths and channel stopper regions are disposed in the column direction, and transfer electrodes are disposed in the row direction.

A border line 6b along which adjacent charge transfer paths face each other via the channel stopper region is similar to the border line of the first embodiment. However, a border line 6a between two sections of the charge transfer path between obliquely adjacent charge accumulation regions is linear as different from the first embodiment.

Similar points to the first embodiment are that each section has a narrow region and a wide region and that the border line 6a is slanted relative to the row direction and disposed long in the charge transfer path. However, since the border line 6a is linear, the channel width in the narrower region changes continuously. Therefore, even under the narrow channel effects, a change in the potential is monotonous and continuous. Therefore, by applying a proper voltage, a possibility of making electric charges stay and be resident in the charge transfer path can be lowered. The transfer performance can be improved further.

As low and high level voltages are applied to adjacent sections, the potential of the section applied with the high level voltage lowers so that electric charges are highly efficiently transferred traversing the long border line 6a. Electric charges traversing the border line 6b are similar to the first embodiment.

Figure 8B:
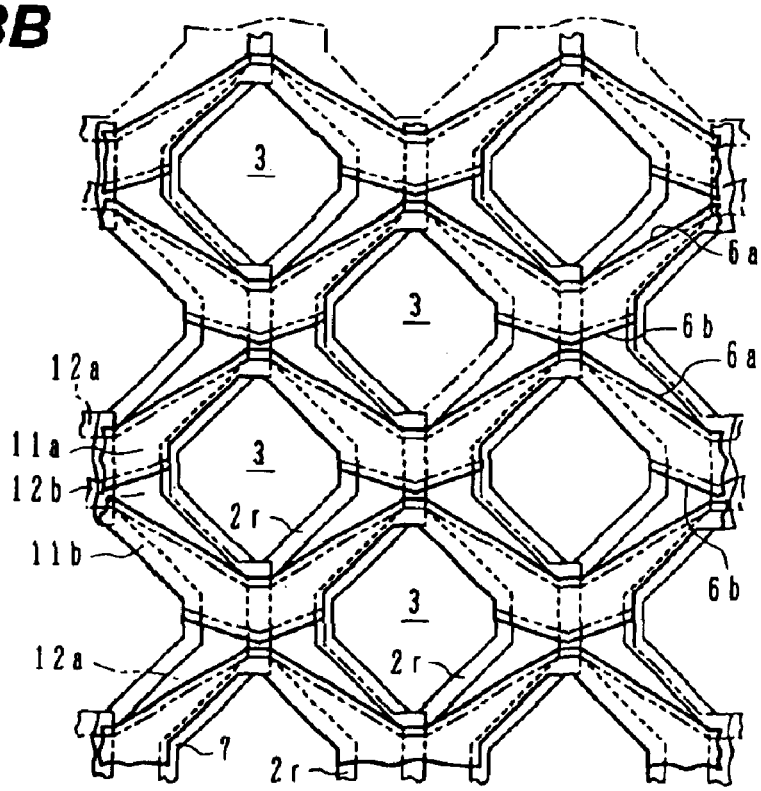

FIG. 8B shows a modification of the second embodiment. The shapes of first- and second-layer transfer electrodes 11 and 12 are made different so that both border lines 6a and 6b are slanted relative to the horizontal direction. Since the border line 6b is slanted and its length is made longer, the charge transfer performance can be improved further.

Figure 9A:
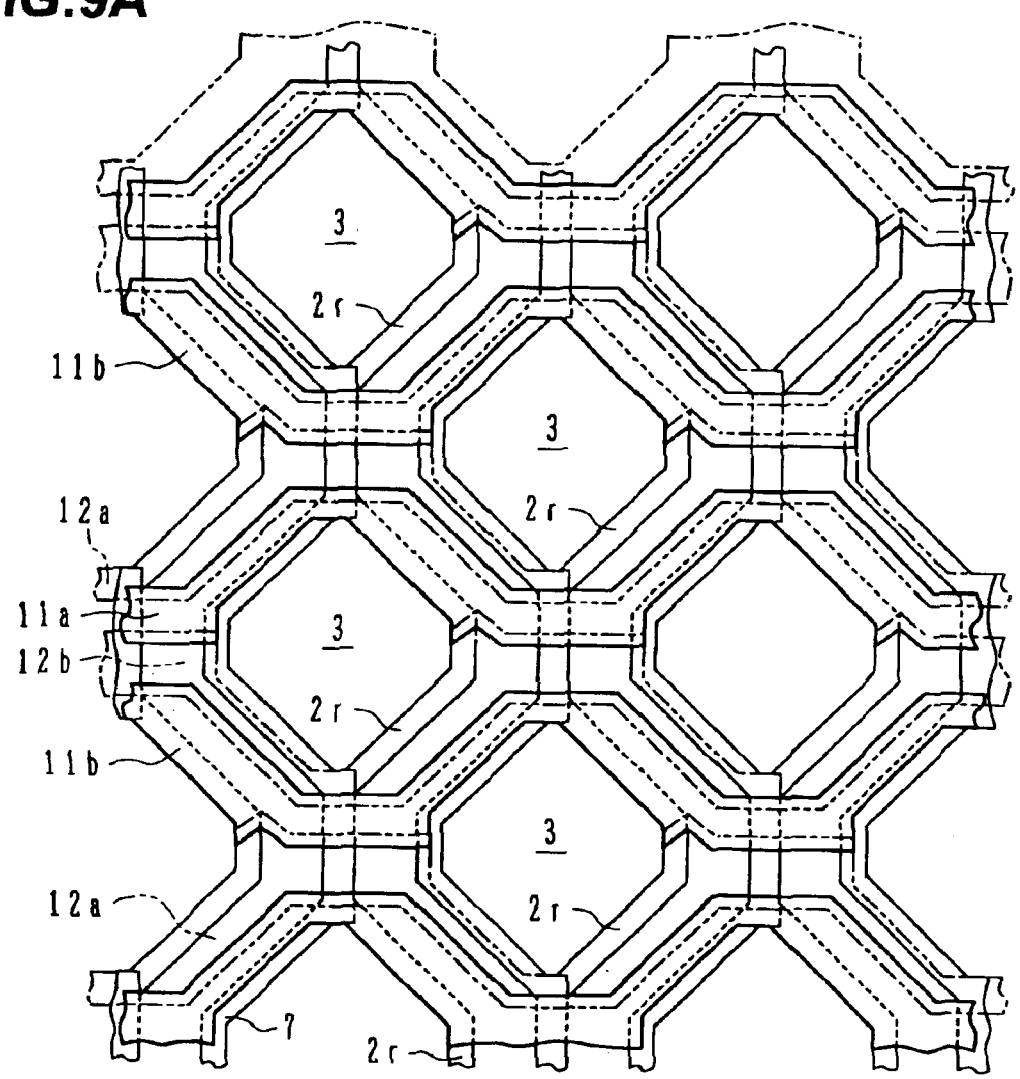
FIGS. 9A and 9B are schematic plan views showing the structures of a solid state image pickup device according to a third embodiment of the invention and its modification.
Figure 9B:
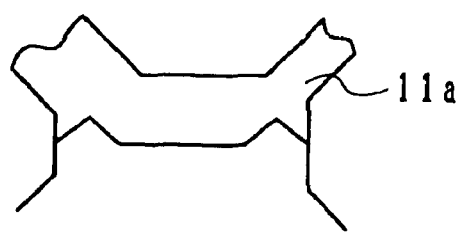

FIGS. 9A and 9B are schematic plan views showing the structure of a solid state image pickup device according to a third embodiment of the invention. In this embodiment, first-layer transfer electrodes 11a and 11b have a recess in the area adjacent to a read gate 2r, and the shapes of second-layer transfer electrodes 12a and 12b are changed correspondingly. Since the second-layer transfer electrode 12 has a partial area whose shape is like an unfolded fan, the read transfer performance can be improved further. More specifically, the width of a region along which electric charges are read from the charge accumulation region 3 to the adjacent charge transfer path 5 via the read gate 2r, becomes wide as viewed along the charge read direction. The efficient charge transfer can therefore be expected.

FIG. 9B shows a modification of the third embodiment.

The transfer electrodes 11 and 12 shown in FIG. 9A have each a laterally unsymmetrical shape. The transfer performance of transferring electric charges in the transfer path by applying drive signals to the transfer electrodes may be influenced by a difference of the transfer electrode shapes between adjacent transfer channels.

The transfer electrodes 11 and 12 shown in FIG. 9B have each a laterally symmetrical shape. Therefore, the transfer performance of transferring electric charges in the charge transfer path can be made uniform at each instance.

Although a solid state image pickup device having a pixel shift structure and weaving charge transfer paths has been described, the embodiment structures may be applied to charge transfer paths extending linearly. Further, although a solid state image pickup device has been described, the embodiment structures of charge transfer path may be applied to various types of charge transfer paths.

FIGS. 10A to 10D are plan views showing examples of sections of a linear charge transfer path according to another embodiment of the invention.

Figure 10A:
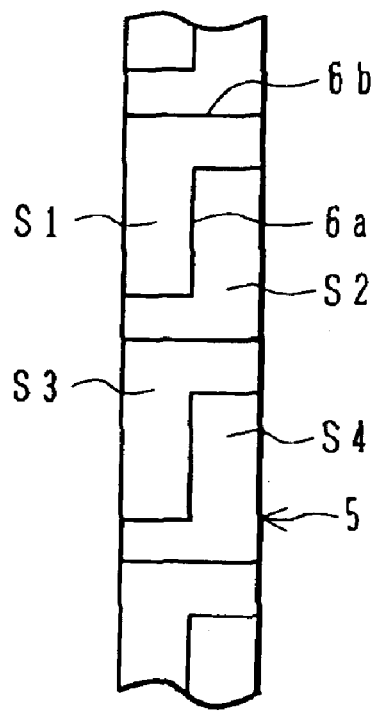
FIGS. 10A, 10B, 10C and 10D are schematic plan views showing the patterns of a charge transfer path according to another embodiment of the invention.

FIG. 10A shows a linear charge transfer path 5 having a repetitive pattern of four sections S1, S2, S3 and S4. Each of the sections S1 to S4 has a wide region and a narrow region similar to the sections S1 to S4 shown in FIG. 4A. With this arrangement, a charge accumulation function of the wide region and an efficient charge transfer via a long border line 6a can be provided similar to the charge transfer described with reference to FIG. 4A.

Figure 10B:
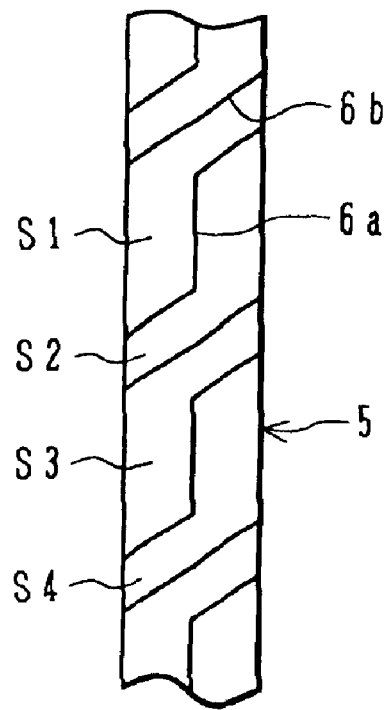

FIG. 10B shows other sections in which the horizontal border lines 6a and 6b shown in FIG. 10A are slanted. Other structures are similar to FIG. 10A. Since the border line 6b is slanted, its length becomes longer and the transfer performance can be improved further. Although the boarder line is slanted relative to the side edge of the charge transfer path, a charge transfer progresses along a direction perpendicular to the border lines and the improved transfer performance described above becomes possible.

Figure 10C:
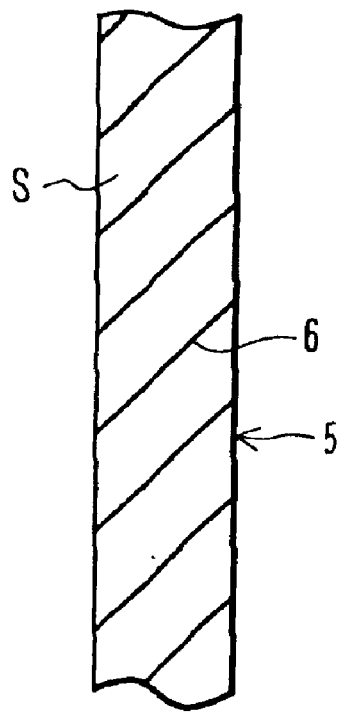

FIG. 10C shows a charge transfer path partitioned into same sections S by straight border lines 6 obliquely disposed throughout the transfer path 5. Since the border line 6 is slanted relative to the horizontal direction, its length becomes longer and the transfer performance can be improved.

Figure 10D:
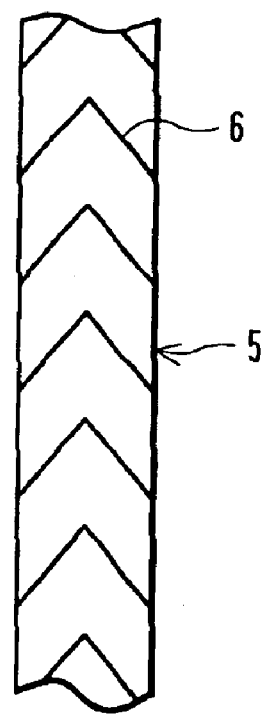
Figure 11:
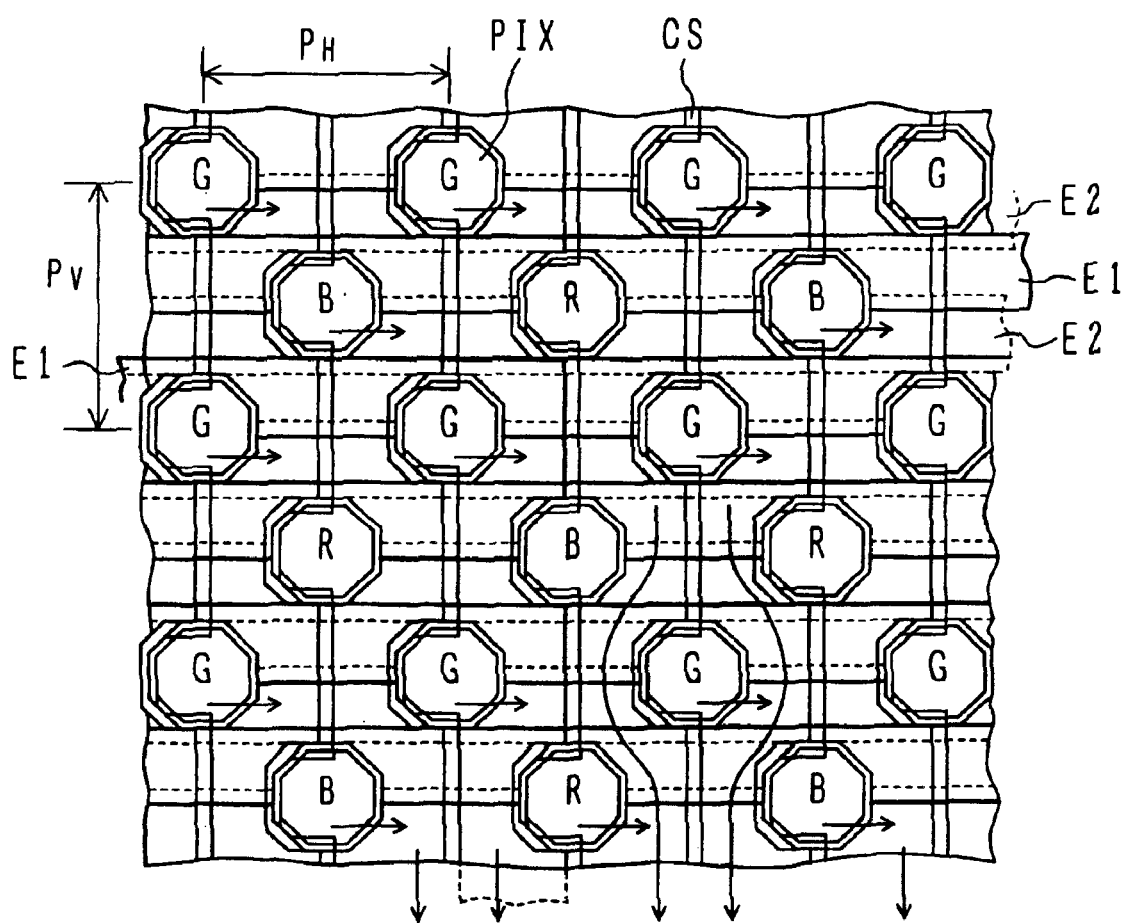
FIG. 11 is a schematic diagram showing the structure of a solid state image pickup device proposed earlier by the present inventor.

FIG. 10D shows a charge transfer path partitioned by border lines of an upward chevron pattern. Since the border line 6 is slanted relative to the horizontal direction, its length becomes longer and the transfer performance can be improved.

If a border line is slanted relative to the horizontal or row direction, it is desired to set the slant angle to 5° or larger in order to make distinctive the slanted effects. Although each section of the charge transfer path has the same area, this area is not necessarily required to be the same. It is however preferable not to make a large difference between respective sections in order to realize an efficient charge transfer. For example, it is preferable that an area ratio between any two sections in the same transfer path is in a range from 1:1 to 1:5 (or 5:1).

Although a charge transfer path having two-layered transfer electrodes has been described, a charge transfer path having three-layered or more transfer electrodes may be used. The drive method is not limited only to four-phase driving.

The present invention has been described in connection with the preferred embodiments. The invention is not limited only to the above embodiments. It is apparent that various modifications, improvements, combinations, and the like can be made by those skilled in the art.

What is claimed is:

1. A charge transfer path comprising:

a semiconductor substrate having a surface region of a first conductivity type;

a channel region formed in the surface region and extending as a whole along one direction (extension direction) on a surface of said semiconductor substrate, said channel region having a second conductivity type opposite to the first conductivity type and having a stripe plan shape defined by a pair of side edges;

an insulating film formed on said semiconductor substrate and covering said channel region; and a plurality of transfer electrodes formed on said insulating film and traversing said channel region, said transfer electrodes having an overlap structure that end portions of adjacent transfer electrodes overlap to define a plurality of border lines of said channel region, and defining a plurality of charge transfer sections partitioned by the border lines in said channel region, wherein each transfer channel region includes a region where a plurality of charge transfer sections are juxtaposed along a direction perpendicular to the extension direction.

2. A charge transfer path according to claim 1, wherein shapes of said channel region and said transfer electrodes are selected so that at least some of said border lines have an angle of 5° or large relative to the perpendicular direction.

3. A charge transfer path according to claim 1, wherein at least some of said border lines have a line segment generally parallel to the side edges.

4. A charge transfer path according to claim 1, wherein at least some of said charge transfer sections have a region whose width along the perpendicular direction changes monotonously.

5. A charge transfer path according to claim 1, wherein said channel region extends and periodically weaves along the extension direction, and at least some of the border lines have a line segment slanted by an angle of 5° or larger relative to the perpendicular direction in a region of said channel region slanted relative to the extension direction.

6. A charge transfer path according to claim 5, wherein adjacent charge transfer sections contact each other along a straight border line in the region of said channel region slanted relative to the extension direction.

7. A charge transfer path according to claim 1, wherein at least some of said charge transfer sections have each a wide region and a narrow region.

8. A charge transfer path according to claim 7, wherein the wide region is positioned at one end of said charge transfer section.

9. A charge transfer path according to claim 8, wherein adjacent charge transfer sections have both the wide region in a nearby area where the adjacent charge transfer sections contact.

10. A charge transfer path according to claim 7, wherein the narrow region reduces a width along the perpendicular direction more at a position remoter from the wide region.

11. A charge transfer path according to claim 1, wherein the pair of side edges are generally parallel and have a direction varying along the channel region, and wherein a portion of the border lines have a direction generally oblique to the direction of the nearest pair of side edges.

12. A solid state image pickup device, comprising:
(a) a semiconductor substrate defining a two-dimensional surface;
(b) a number of photoelectric conversion elements disposed on the surface of said semiconductor substrate along a plurality of rows and columns at constant pitches, said photoelectric conversion elements in an even column being shifted by about a half of a photoelectric conversion element pitch in the even column from said photoelectric conversion elements in an odd column, said photoelectric conversion elements in an even row being shifted by about a half of a photoelectric conversion element pitch in the even row from said photoelectric conversion elements in an odd row, and each photoelectric conversion element column including only said photoelectric conversion elements in either the odd column or the even column;
(c) a plurality of transfer channel regions formed on said semiconductor substrate, each being disposed near a corresponding photoelectric conversion element column, having a stripe plan shape defined by a pair of side edges, and extending and weaving along the column direction; and
(d) a plurality of transfer electrodes traversing said transfer channel regions and extending as a whole in the row direction, said transfer electrodes having an overlap structure that end portions of adjacent transfer electrodes overlap to define a plurality of border lines of said transfer channel region, and defining a plurality of charge transfer sections partitioned by the border lines in said channel-regions,
wherein each transfer channel region includes a region where a plurality of charge transfer sections are juxtaposed along a direction perpendicular to the extension direction.

13. A solid state image pickup device according to claim 12, wherein shapes of said channel region and said transfer electrodes are selected so that at least some of said border lines have an angle of 5° or large relative to the perpendicular direction.

14. A solid state image pickup device according to claim 12, wherein at least some of said border lines have a line segment generally parallel to the side edges.

15. A solid state image pickup device according to claim 12, wherein at least some of said charge transfer sections have a region whose width along the perpendicular direction changes monotonously.

16. A solid state image pickup device according to claim 12, wherein said channel region extends and periodically weaves along the extension direction, and at least some of the border lines have a line segment slanted by an angle of 5° or larger relative to the perpendicular direction in a region of said channel region slanted relative to the extension direction.

17. A solid state image pickup device according to claim 16, wherein adjacent charge transfer sections contact each other along a straight border line in the region of said channel region slanted relative to the extension direction.

18. A solid state image pickup device according to claim 12, wherein at least some of said charge transfer sections have each a wide region and a narrow region.

19. A solid state image pickup device according to claim 18, wherein the wide region is positioned at one end of said charge transfer section.

20. A solid state image pickup device according to claim 19, wherein adjacent charge transfer sections have both in wide region in a nearby area where the adjacent charge transfer sections contact.

21. A solid state image pickup device according to claim 18, wherein the narrow region reduces a width along the perpendicular direction more at a position remoter from the wide region.

22. A solid state image pickup device according to claim 12, wherein an area ratio between any two of the charge transfer sections is in a range from 1:1 to 1:5.

23. A method of driving a solid state image pickup device, comprising: a semiconductor substrate defining a two-dimensional surface; a number of photoelectric conversion elements disposed on the surface of the semiconductor substrate along a plurality of rows and columns at constant pitches, the photoelectric conversion elements in an even column being shifted by about a half of a photoelectric conversion element pitch in the even column from the photoelectric conversion elements in an odd column, the photoelectric conversion elements in an even row being shifted by about a half of a photoelectric conversion element pitch in the even row from the photoelectric conversion elements in an odd row, and each photoelectric conversion element column including only the photoelectric conversion elements in either the odd column or the even column; a plurality of transfer channel regions formed on the semiconductor substrate, each being disposed near a corresponding photoelectric conversion element column, having a stripe plan shape defined by a pair of side edges, and extending and weaving along the column direction; and a plurality of transfer electrodes traversing the transfer channel regions and extending as a whole in the row direction, the transfer electrodes having an overlap structure that end portions of adjacent transfer electrodes overlap to define a plurality of border lines of the transfer channel region, and defining a plurality of charge transfer sections partitioned by the border lines in the channel regions, wherein each transfer channel region includes a region where a plurality of charge transfer sections are juxtaposed along a direction perpendicular to the extension direction, the method comprising the steps of:

(a) accumulating electric charges in the photoelectric conversion elements;

(b) applying a read level voltage to a first charge transfer section near the photoelectric conversion elements and applying a transfer high level voltage to a second charge transfer section adjacent to the first charge transfer section in the row direction; and (c) changing the voltage applied to the first charge transfer section to the transfer high level voltage.

24. A method of driving a solid state image pickup device according to claim 23, wherein said steps (b) and (c) are repetitively executed relative to the photoelectric conversion elements in the odd and even rows.

25. A charge transfer path, comprising:

a semiconductor substrate having a surface region of a first conductivity type;

a channel region formed in the surface region of semiconductor substrate, the channel region having a second conductivity type, wherein the channel region forms a stripe plan shape defined by a pair of side edges, the pair of side edges having a direction that varies along the channel region;

an insulating film formed on the semiconductor substrate and covering the channel region; and a plurality of transfer electrodes formed on the insulating film and extending within the channel region, each of the plurality of transfer electrodes having an overlap structure formed with an adjacent one of the plurality of transfer electrodes, such that pairs of adjacent electrodes are formed within the channel region, each of the pairs of adjacent electrodes defining a border line in the channel region, the border line dividing the pair of adjacent electrodes into partitioned charge transfer sections;

wherein a portion of the border line extends generally parallel to the direction of the nearest pair of side edges of the channel region, allowing charge transfer to traverse the border line between the adjacent pair of electrodes in a direction generally perpendicular to the direction of the nearest pair of side edges of the channel region.

26. A solid state image pickup device, comprising:

a semiconductor substrate defining a two-dimensional surface;

a plurality of photoelectric conversion elements disposed on the surface of the semiconductor substrate along a plurality of rows and columns at constant pitches, the photoelectric conversion elements in each column being shifted by about a half of a photoelectric conversion element pitch relative to each adjacent column, and the photoelectric conversion elements in each row being shifted by about a half of a photoelectric conversion element pitch relative to each adjacent row; and a plurality of transfer channel regions formed on the semiconductor substrate, each of the plurality of transfer channel regions being disposed along a corresponding photoelectric conversion element column, wherein each of the plurality of transfer channel regions has a stripe plan shape defined by a pair of generally parallel side edges, each of the plurality of channel regions extending and weaving along the column direction, and the direction of the pair of generally parallel side edges varying with the weaving along the column direction;

wherein a plurality of transfer electrodes extend within each of the plurality of transfer channel regions, the plurality of transfer electrodes being arranged in pairs having an overlap structure between the two transfer electrodes in each pair, the adjacent transfer electrodes in each pair defining a border line and charge transfer section partitioned by the border line;

wherein a portion of each border line forms a portion of the charge transfer section that allows charge transfer in a direction generally perpendicular or oblique to the direction of the nearest pair of side edges of the channel region.

27. A method of driving a solid state image pickup device, the device comprising a semiconductor substrate defining a two-dimensional surface; a plurality of photoelectric conversion elements disposed on the surface of the semiconductor substrate along a plurality of rows and columns at constant pitches, the photoelectric conversion elements in each column being shifted by about a half of a photoelectric conversion element pitch relative to each adjacent column, and the photoelectric conversion elements in each row being shifted by about a half of a photoelectric conversion element pitch relative to each adjacent row; and a plurality of transfer channel regions formed on the semiconductor substrate, each of the plurality of transfer channel regions being disposed along a corresponding photoelectric conversion element column, wherein each of the plurality of transfer channel regions has a stripe plan shape defined by a pair of generally parallel side edges, each of the plurality of channel regions extending and weaving along the column direction, and the direction of the pair of generally parallel side edges varying with the weaving along the column direction; wherein a plurality of transfer electrodes extend within each of the plurality of transfer channel regions, the plurality of transfer electrodes being arranged in pairs having an overlap structure between the two transfer electrodes in each pair, the adjacent transfer electrodes in each pair defining a border line and charge transfer section partitioned by the border line; wherein a portion of each border line forms a portion of the charge transfer section that allows charge transfer in a direction generally perpendicular or oblique to the direction of the nearest pair of side edges of the channel region; the method comprising:

accumulating electric charges in the plurality of photoelectric conversion elements;

applying a read level voltage to a first charge transfer section for each of the pair of transfer electrodes near one of the plurality of photoelectric conversion elements and applying a transfer high level voltage to a second charge transfer section for each of the pair of transfer electrodes adjacent to the first charge transfer section; and changing the voltage applied to the first charge transfer section to a voltage approximately equal to the transfer high level voltage.

* * * * *